(12) United States Patent
Liew et al.

(10) Patent No.: US 12,119,239 B2
(45) Date of Patent: Oct. 15, 2024

(54) PACKAGED SEMICONDUCTOR DEVICES, AND PACKAGE MOLDS FOR FORMING PACKAGED SEMICONDUCTOR DEVICES

(71) Applicant: Wolfspeed, Inc., Durham, NC (US)

(72) Inventors: Soon Lee Liew, Perak (MY); Eng Wah Woo, Perak (MY); Alexander Komposch, Morgan Hill, CA (US); Kok Meng Kam, Perak (MY); Samantha Cheang, Perak (MY)

(73) Assignee: Wolfspeed, Inc., Durham, NC (US)

( * ) Notice: Subject to any disclaimer, the term of this patent is extended or adjusted under 35 U.S.C. 154(b) by 256 days.

(21) Appl. No.: 17/532,027

(22) Filed: Nov. 22, 2021

(65) Prior Publication Data
US 2023/0162991 A1    May 25, 2023

(51) Int. Cl.
*H01L 23/495* (2006.01)
*H01L 21/56* (2006.01)
*H01L 23/31* (2006.01)

(52) U.S. Cl.
CPC ........ *H01L 21/565* (2013.01); *H01L 23/3114* (2013.01); *H01L 23/49541* (2013.01)

(58) Field of Classification Search
CPC ............... H01L 21/565; H01L 23/3114; H01L 23/49541; H01L 23/3107
USPC ....................................................... 257/667
See application file for complete search history.

(56) References Cited

U.S. PATENT DOCUMENTS

2016/0361848 A1*  12/2016  Roberts ............... B29C 44/1219

* cited by examiner

*Primary Examiner* — Caleb E Henry
*Assistant Examiner* — Dilinh P Nguyen
(74) *Attorney, Agent, or Firm* — Sage Patent Group

(57) ABSTRACT

A package mold according to some embodiments includes a first mold body and a second mold body, a mold cavity in the first mold body, a gate in a first side of the mold cavity for supplying liquid mold compound into the mold cavity, a longitudinal vent for releasing gas from the mold cavity in a second side of the mold cavity opposite the first side of the mold cavity, and a transverse vent for releasing gas from the mold cavity in a third side of the mold cavity that extends between the first and second sides of the mold cavity. Methods of packaging an electronic device using the package mold and resulting packaged devices are also disclosed.

12 Claims, 6 Drawing Sheets

PACKAGED SEMICONDUCTOR DEVICES, AND PACKAGE MOLDS FOR FORMING PACKAGED SEMICONDUCTOR DEVICES

FIELD

The disclosure relates to packaging structures and methods for semiconductor devices.

BACKGROUND

Semiconductor devices are often used in systems that are exposed to a variety of harsh environmental conditions. For example, semiconductor devices may be exposed to extreme temperature ranges, humidity ranges, and/or other environmental conditions that may negatively impact the semiconductor devices. Moreover, semiconductor devices are often required to operate at or near their rated currents and voltages over extended periods of time. Operating in extreme environmental conditions and/or at elevated levels may lead to failure of the devices and/or deterioration in semiconductor device performance.

To protect semiconductor devices during operation and to provide for enhanced heat removal, the devices may be packaged in packages including molded plastic bodies the provided mechanical and/or environmental protection to the semiconductor devices inside.

A conventional leadframe 10 is shown in FIG. 1A. The leadframe 10, which may be formed of copper (Cu), includes a plurality of leads 12 connected to the leadframe 10 and to each other by tie bars 13. The leadframe may include a die attach pad (not shown) on which one or more semiconductor devices (not shown) may be mounted.

During a manufacturing process, semiconductor devices are mounted onto the die attach pad, and wire bonds are formed to connect bond pads on the semiconductor devices to the leads 12. A package body is then overmolded onto the lead frame 10. The tie bars 13 are then trimmed away to separate the leads 12.

FIG. 1B is a side cutaway illustration of the process of molding a package body onto a lead frame 10. As shown in FIG. 1B, a package mold 30 includes an upper mold body 32 and a lower mold body 34 that together define a mold cavity 20. A leadframe 10 is placed in the mold cavity 20, and the package mold 30 is closed by bringing the upper mold body 32 and the lower mold body 34 into contact.

As further shown in FIG. 1B, the package mold 30 includes a gate 22 for allowing a liquid mold compound 38 to flow into the mold cavity 20 and an air vent 16 for allowing air in the mold cavity to escape. The liquid mold compound 38 is supplied to the gate 22 through a mold runner 14, which is a passage from the source of the liquid mold compound through the mold body 30.

As the liquid mold compound 38 fills the mold cavity 20, air in the mold cavity is expelled through the air vent 16. Once the liquid mold compound 38 has completely filled the mold cavity 20, the liquid mold compound 38 is cured, for example, via heat or radiation, to form a solid package body 40 on the leadframe 10. The package mold 30 is then opened, and the package body is removed from the mold cavity 20.

SUMMARY

A method of forming a packaged semiconductor device according to some embodiments includes placing a leadframe in a mold cavity of a package mold. The package mold includes a first mold body and a second mold body, where the mold cavity is in the first mold body. The package mold further includes a gate in a first side of the mold cavity for supplying liquid mold compound into the mold cavity, a longitudinal vent for releasing gas from the mold cavity in a second side of the mold cavity opposite\e the first side of the mold cavity, and a transverse vent for releasing gas from the mold cavity in a third side of the mold cavity that extends between the first and second sides of the mold cavity. The method further includes placing a leadframe in the mold cavity, wherein the leadframe includes a lead extending away from the mold cavity on the third side of the mold cavity, and closing the mold by bringing the second mold body into contact with the first mold body. Liquid mold compound is flowed through the gate into the mold cavity, such that the liquid mold compound flows in a longitudinal direction from the first side of the mold cavity toward the second side of the cavity. Gas is released from the mold cavity through the longitudinal vent and the transverse vent as the mold cavity is filled with liquid mold compound.

In some embodiments, the transverse vent includes a first transverse vent, and the package mold further includes a second transverse vent in the third side of the mold cavity. The mold cavity may further include a fourth side opposite the third side and a second transverse vent in the fourth side of the mold cavity. The mold cavity may include a third transverse vent in the third side of the mold cavity and a fourth transverse vent in the fourth side of the mold cavity.

The lead may include a first lead, and the leadframe may include a second lead that extends away from the mold cavity on the second side of the mold cavity.

In some embodiments, the leadframe may include a plurality of first leads extending away from the mold cavity on the third side of the mold cavity.

The leadframe may include a vent support that extends away from the mold cavity at a location of the transverse vent. The vent support may include a metal tab having a hole therethough where the metal tab crosses the third side of the mold cavity.

A package mold according to some embodiments includes a first mold body and a second mold body, a mold cavity in the first mold body, a gate in a first side of the mold cavity for supplying liquid mold compound into the mold cavity, a longitudinal vent for releasing gas from the mold cavity in a second side of the mold cavity opposite the first side of the mold cavity, and a transverse vent for releasing gas from the mold cavity in a third side of the mold cavity that extends between the first and second sides of the mold cavity.

The transverse vent may include a first transverse vent, and the package mold may further include a second transverse vent in the third side of the mold cavity.

The transverse vent may include a first transverse vent, and wherein the mold cavity further may include a fourth side opposite the third side and a second transverse vent in the fourth side of the mold cavity.

The mold cavity may include a third transverse vent in the third side of the mold cavity and a fourth transverse vent in the fourth side of the mold cavity.

A packaged semiconductor device according to some embodiments includes a leadframe having a lead, a semiconductor device on the leadframe, and a molded package body on the leadframe, the molded package body covering the semiconductor device, wherein the lead extends from a first side of the molded package body. The leadframe includes a vent support that extends to the first side of the molded package body. The vent support may include a metal tab having a hole therethough at the first side of the molded package body.

In some embodiments, the vent support may include a first vent support, and the packaged semiconductor device may further include a second vent support at the first side of the molded package body.

In some embodiments, the packaged semiconductor device may further include a second vent support that extends to a second side of the molded package body opposite the first side.

In some embodiments, the packaged semiconductor may further include a third vent support at the first side of the package body and a fourth vent support at the second side of the package body.

In some embodiments, the packaged semiconductor may further include a fifth vent support at a third side of the package body that extends between the first and second sides of the package body.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1A:
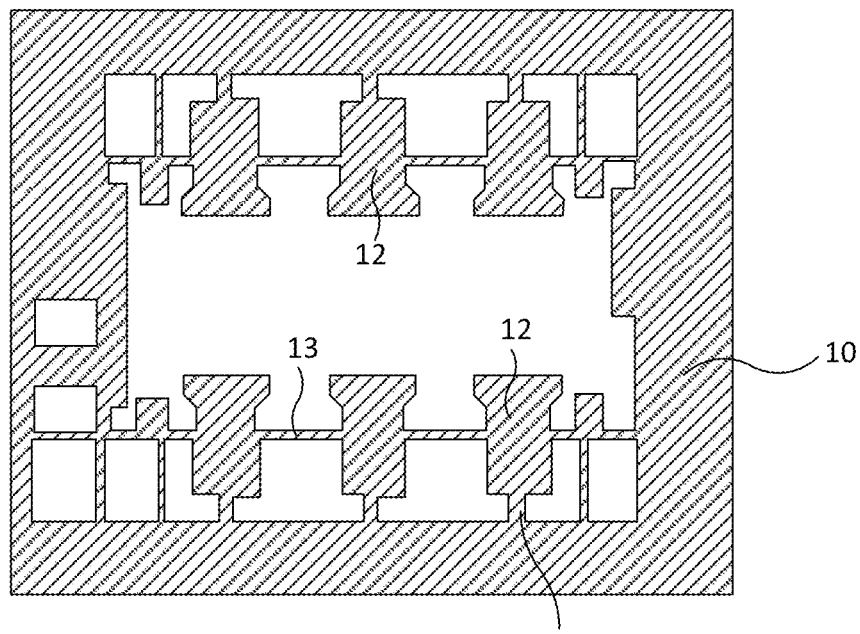
FIGS. 1A and 1B illustrate conventional mold arrangements and packaging methods.
Figure 1B:
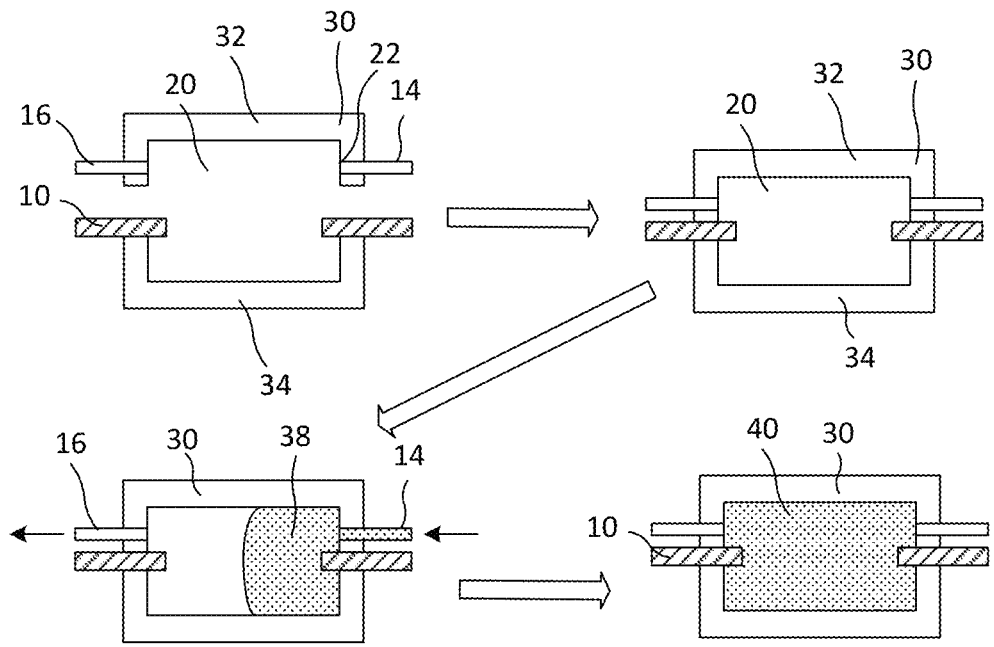

Embodiments of the inventive concepts are explained more fully with reference to the non-limiting aspects and examples that are described and/or illustrated in the accompanying drawings and detailed in the following description. It should be noted that the features illustrated in the drawings are not necessarily drawn to scale, and features of some embodiments may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

As noted above, in a conventional packaging method for semiconductor devices, liquid mold compound is supplied via a mold runner through a gate into a mold cavity in which a leadframe has been placed. As the mold compound fills the mold cavity, air in the mold cavity escapes through an air vent. The gate and air vent are typically on opposite ends of the mold cavity, so that the liquid mold compound enters the mold cavity through the gate at a first end and flows across the mold cavity toward the air vent 16 at a second end of the mold cavity opposite the first end. Typically, the gate and air vent are positioned at opposite ends of the mold cavity, while the package leads extend in a transverse direction from sides of the mold cavity. That is, the liquid mold compound flows in a direction parallel to the orientation of the sides of the mold cavity from which the package leads extend.

Although this approach may be useful for packaging conventional leadframes, problems may arise when an unconventional leadframe design is used, such as a leadframe that has leads that extend from the ends of the mold cavity in addition to the sides of the mold cavity.

Figure 2:
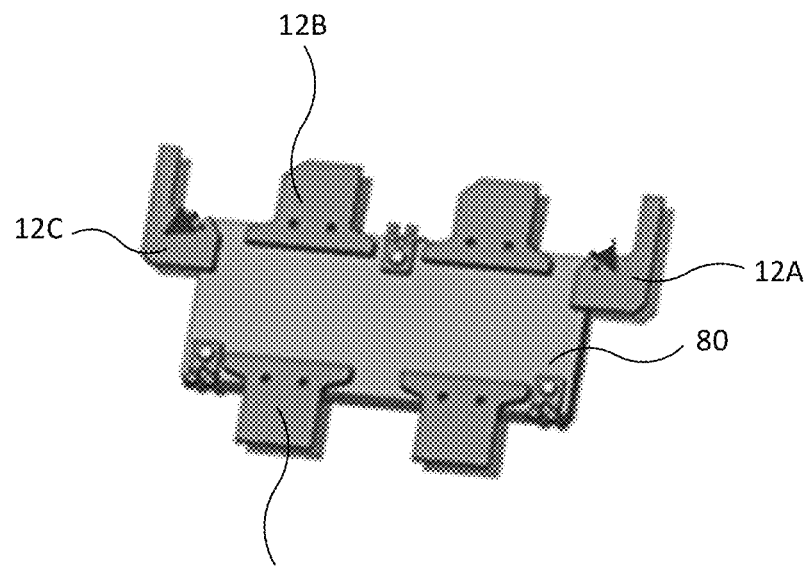
FIG. 2 illustrates a TO248 leadframe that may be included in a package according to some embodiments described herein.

For example, a TO248 package leadframe 80 as shown in FIG. 2 may be used for high-frequency applications. The package leadframe 80 shown in FIG. 2 has so-called "smart leads" 12A, 12C that extend from opposite ends of the package leadframe 80 in addition to conventional leads 12B, 12D that extend from the sides of the package leadframe 80. The smart leads 12A, 12C are able to extend the resonance frequency of a device formed on the package leadframe 80 to achieve a wider video bandwidth. However, the presence of such "smart leads" 12A, 12C at the ends of the package leadframe 80 may create a risk of mold flash accumulation when a standard air vent position is used. "Mold flash" refers to excess material attached to a molded product. Mold flash is typically caused by leakage of the liquid mold compound between the two surfaces of a mold or between the base material and the mold in the case of overmolding. Such material is typically trimmed away as part of the manufacturing process.

If mold flash blocks the air vent, wire sweep may occur and/or internal void defects may be formed in the package body. That is, mold flash blocking the vent may cause the flow of liquid molding compound to be unbalanced, which may result in air becoming trapped inside the mold cavity. This can lead to mold voids and/or wire sweep in the finished device. As is known in the art, wire sweep occurs when bonded wires within the package are not correctly aligned in the horizontal plane (as opposed to wire sag, which is in the vertical orientation).

Figure 3:
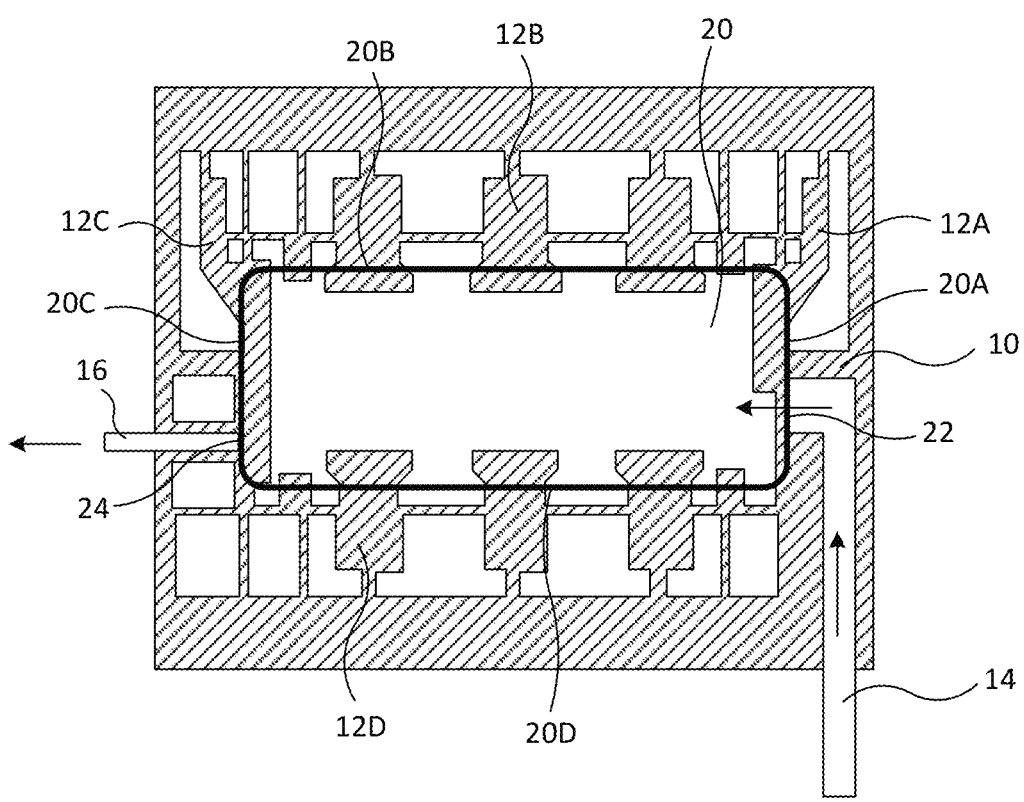
FIG. 3 illustrates a leadframe and a mold cavity superimposed thereon.

This problem is illustrated in more detail in FIG. 3, which illustrates a leadframe 10 and a mold cavity 20 superimposed thereon. The mold cavity 20 has opposing ends 20A, 20C, that are separated in a longitudinal direction and sides 20B, 20D that extend in the longitudinal direction between the opposing ends 20A, 20C. The leadframe 10 includes leads 12B, 12D that extend from sides 20B, 20D of the mold cavity 20 and "smart leads" 12A, 12C that extend from opposite ends 20A, 20C of the mold cavity. A gate 22 connected to a mold runner 14 is provided at the first end 20A of the mold cavity 20, and an air vent 16 is provided at the second end 20C of the mold cavity 20. When liquid mold compound is supplied into the mold cavity 20 from the runner 14 via the gate 22, mold flashing may build up near the second end 20C of the mold cavity 20, which may fully or partially block the air vent 16 formed at the second end 20C of the mold cavity 20. As noted above, the mold flashing may interfere with the venting of air from the mold cavity, which may cause voids to form in the package body and/or may cause wire sweep, both of which are undesirable.

Some embodiments described herein provide package molds with multiple air vents that are arranged in a transverse direction to the direction of flow of liquid mold compound through the mold cavity. Such an arrangement may allow air to be more efficiently expelled from the mold cavity when it becomes pressurized as liquid mold compound is introduced into the cavity. This may reduce the trapping of air inside the mold cavity that could lead to the formation of internal mold voids. Such an arrangement may be particularly useful in applications that are not appropriate for the use of vacuum venting.

Figure 4:
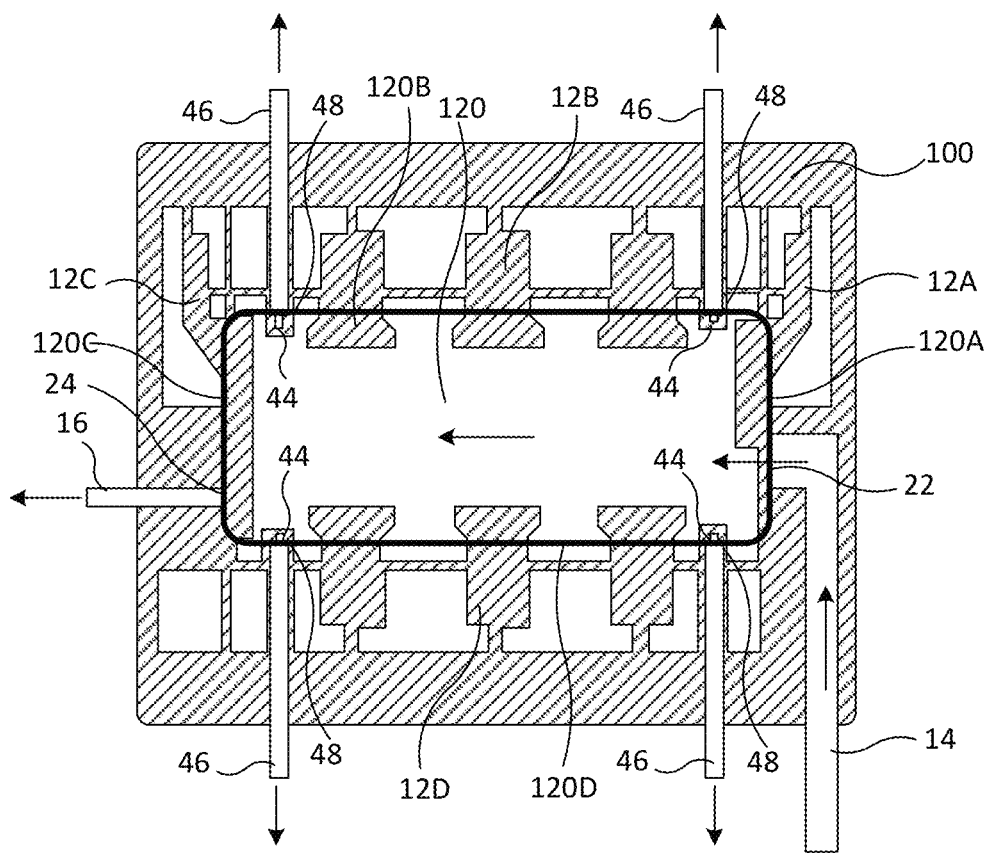
FIG. 4 illustrates a mold arrangement according to some embodiments.

A mold arrangement according to some embodiments is shown in FIG. 4, which illustrates a leadframe 100 and a mold cavity 120 superimposed thereon. The mold cavity 120 has opposing ends 120A, 120C, that are separated in a longitudinal direction (i.e., the horizontal direction relative to the orientation of FIG. 4) and sides 120B, 120D that extend in the longitudinal direction between the opposing ends 120A, 120C. The leadframe 100 includes leads 12B, 12D that extend from top and bottom sides 120B, 120D of the mold cavity 120 and leads 12A, 12C that extend from opposite ends 120A, 120C of the mold cavity. A gate 22 connected to a mold runner 14 is provided at the first end 120A of the mold cavity 120, and a longitudinal air vent 16 is provided at the second end 120C of the mold cavity 120 to vent air longitudinally as liquid mold compound fills the mold cavity 120.

In addition to the longitudinal air vent 16, a plurality of transverse air vents 46 are provided in the mold to vent air in a transverse direction relative to the direction of flow of mold compound in the mold cavity 120 (i.e., in the vertical direction relative to the orientation of FIG. 4). The transverse air vents 46 may be provided adjacent to or between respective leads 12B, 12D that extend from the top and bottom sides 120B, 120D of the mold cavity 120. In the embodiment illustrated in FIG. 4, two transverse air vents 46 are provided in each of the top and bottom sides 120B, 120D of the mold cavity 120. However, more or fewer transverse air vents 46 may be provided depending on the implementation. For example, some embodiments may only include a single transverse air vent 46 extending from each side 120B, 12D of the mold cavity 120. In some embodiments, there may be no transverse air vent 46 extending from one of the sides 120B, 12D of the mold cavity 120. In some embodiments, there may be more than two transverse air vents 46 extending from one of the sides 120B, 12D of the mold cavity 120.

As further illustrated in FIG. 4, the leadframe 100 may include a vent support structure 48 aligned with each of the transverse air vents 46. The vent support structure 48 may include a metal tab in which a hole 44 is provided therethrough where the metal tab crosses the side of the mold cavity 120.

Figure 5:
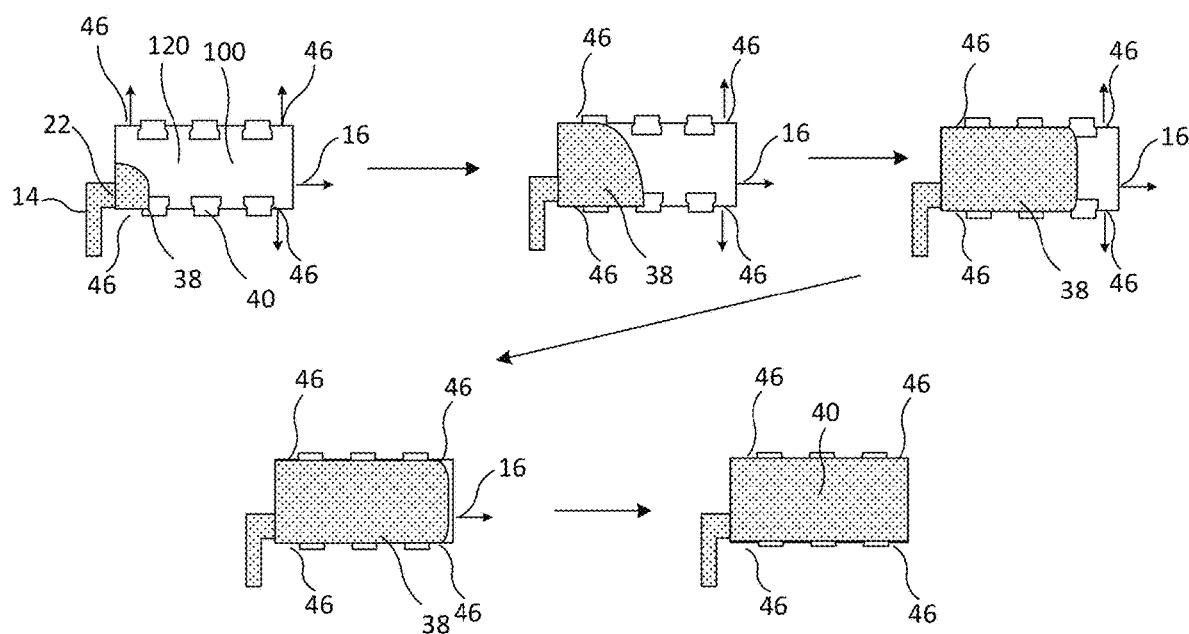
FIG. 5 illustrates a process of forming a package body on a leadframe according to some embodiments.

FIG. 5 illustrates a process of forming a package body 40 on a leadframe 100 according to some embodiments. A mold (not shown) includes a gate 22 through which liquid mold compound is supplied into a mold cavity 120 from a mold runner 14. The mold includes a longitudinal air vent 16 at an opposite end of the mold cavity 120 from the gate 22 and four transverse air vents 46 arranged on the sides of the mold cavity 120. As the liquid mold compound 38 is pushed through the mold runner 14 into the mold cavity 120, pressure increases within the mold cavity 120, causing air in the mold cavity 120 to vent out through all of the air vents 16, 46. The transverse air vents 46 allow the liquid mold compound 38 to flow evenly to the sides of the mold cavity 120. As the liquid mold compound 38 fills the mold cavity 120, the transverse air vents 46 nearest the gate 22 become blocked, cutting off the flow of air therethrough. However, air continues to flow out of the mold cavity 120 through the remaining air vents 16, 46 until the mold cavity 120 is completely filled with liquid mold compound 38. The liquid mold compound 38 is then cured to form a hardened package body 40, at which time the mold may be opened.

Figure 6:
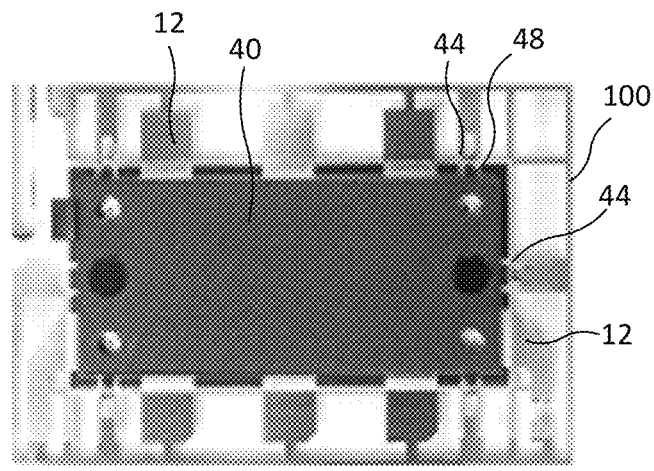
FIGS. 6 and 7 are images of a leadframe onto which a package body has been molded.

FIG. 6 is a picture of a leadframe 100 onto which a package body 40 has been molded, but before the external structure of the leadframe 100 has been trimmed away. The vent support structures 48 including the holes 44 therethrough are still present in the structure.

Figure 7:
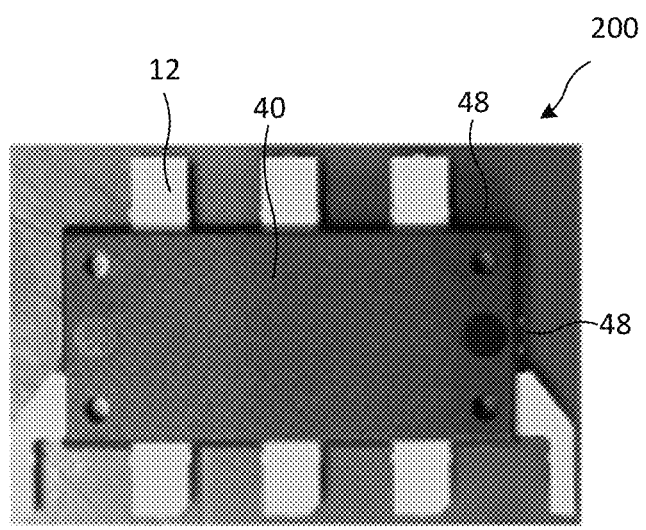

FIG. 7 is a picture of a completed package 200 including a molded package body 40 from which a plurality of metal leads 12 extend after the leadframe 100 has been trimmed. Trimmed ends of the vent support structures 48 may still be evident where the vent support structures 48 were trimmed from the package.

Figure 8:
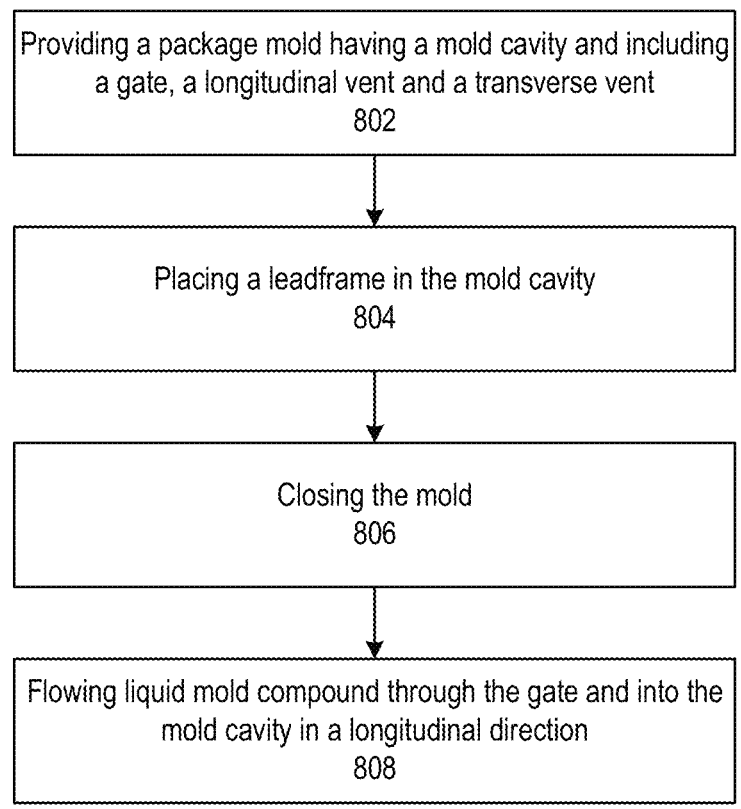
FIG. 8 is a flowchart that illustrates a method of forming a packaged semiconductor device according to some embodiments.

FIG. 8 is a flowchart of operations for forming a packaged semiconductor device according to some embodiments.

Referring to FIG. 8, a method of forming a packaged semiconductor device includes providing a package mold (block 802) and placing (block 804) a leadframe in a mold cavity of the package mold. The package mold includes a first mold body and a second mold body, where the mold cavity is in the first mold body. The package mold further includes a gate in a first side of the mold cavity for supplying liquid mold compound into the mold cavity, a longitudinal vent for releasing gas from the mold cavity in a second side of the mold cavity opposite the first side of the mold cavity, and a transverse vent for releasing gas from the mold cavity in a third side of the mold cavity that extends between the first and second sides of the mold cavity. The leadframe includes a lead extending away from the mold cavity on the third side of the mold cavity. The method further includes closing the mold (block 806) by bringing the second mold body into contact with the first mold body. Liquid mold compound is then flowed (block 808) through the gate into the mold cavity, such that the liquid mold compound flows in a longitudinal direction from the first side of the mold cavity toward the second side of the cavity. Gas is released from the mold cavity through the longitudinal vent and the transverse vent as the mold cavity is filled with liquid mold compound.

Although embodiments of the inventive concepts have been described in considerable detail with reference to certain configurations thereof, other versions are possible. The field plates and gates can also have many different shapes and can be connected to the source contact in many different ways. Accordingly, the spirit and scope of the invention should not be limited to the specific embodiments described above.

The invention claimed is:

1. A package mold, comprising:
    a first mold body and a second mold body;
    a mold cavity defined in between the first mold body and the second mold body by the first mold body and the second mold body being brought into contact;
    a gate in a first side of the mold cavity for supplying liquid mold compound into the mold cavity;
    a longitudinal vent for releasing gas from the mold cavity in a second side of the mold cavity opposite the first side of the mold cavity; and
    a transverse vent for releasing gas from the mold cavity in a third side of the mold cavity that extends from the first side of the mold cavity to the second side of the mold cavity and between the first and second sides of the mold cavity.

2. The package mold of claim 1, wherein the transverse vent comprises a first transverse vent and a second transverse vent in the third side of the mold cavity.

3. The package mold of claim 1, further comprising another transverse vent for releasing gas from the mold cavity in a fourth side of the mold cavity that is opposite the third side of the mold cavity, and extends from the first side of the mold cavity to the second side of the mold cavity and between the first and second sides of the mold cavity.

4. The package mold of claim 3, wherein the mold cavity-another transverse vent comprises a third transverse vent and a fourth transverse vent in the fourth side of the mold cavity.

5. A packaged semiconductor device, comprising:
    a leadframe having a lead;
    a semiconductor device on the leadframe; and
    a molded package body on the leadframe, the molded package body covering the semiconductor device, the molded package body comprising a first mold body, a second mold body, a mold cavity defined in between the first mold body and the second mold body by the first mold body and the second mold body being brought into contact, a gate in a first side of the mold cavity for supplying liquid mold compound into the mold cavity, a longitudinal vent for releasing gas from the mold cavity in a second side of the mold cavity opposite the first side of the mold cavity, and a transverse vent for releasing gas from the mold cavity in a third side of the mold cavity that extends from the first side of the mold cavity to the second side of the mold cavity and between the first and second sides of the mold cavity,
    wherein the lead extends from the first side of the mold cavity,
    wherein the leadframe comprises a vent support that extends away from the third side of the mold cavity and aligns with the transverse vent.

6. The packaged semiconductor device of claim 5, wherein the vent support comprises a metal tab having a hole therethrough at the third side of the mold cavity.

7. The packaged semiconductor device of claim 5, wherein the transverse vent comprises a first transverse vent and a second transverse vent at the third side of the mold cavity.

8. The packaged semiconductor device of claim 7, wherein the vent support comprises a first vent support and a second vent support at the third side of the molded package body mold cavity aligning with the first transverse vent and the second transverse vent respectively.

9. The packaged semiconductor device of claim 5, wherein the molded package body further comprises another transverse vent for releasing gas from the mold cavity in a fourth side of the mold cavity that is opposite the third side of the mold cavity, and extends from the first side of the mold cavity to the second side of the mold cavity and between the first and second sides of the mold cavity, and wherein the leadframe further comprises another vent support that extends away from the fourth side of the mold cavity and aligns with the another transverse vent.

10. The packaged semiconductor device of claim 9, wherein the another transverse vent comprises a third transverse vent and a fourth transverse vent at the fourth side of mold cavity.

11. The packaged semiconductor device of claim 10, wherein the another vent support comprises a third vent support and a fourth vent support at the fourth side of the mold cavity aligning with the third transverse vent and the fourth transverse vent respectively.

12. A packaged semiconductor device, comprising:
    a leadframe;
    a semiconductor device on the leadframe; and
    a molded package body on the leadframe, the molded package body covering the semiconductor device, the molded package body comprising a mold cavity, a gate in a first side of the mold cavity for supplying liquid mold compound into the mold cavity, a longitudinal vent for releasing gas from the mold cavity in a second side of the mold cavity opposite the first side of the mold cavity, and a transverse vent for releasing gas from the mold cavity in a third side of the mold cavity that extends from the first side of the mold cavity to the second side of the mold cavity and between the first and second sides of the mold cavity, wherein the leadframe comprises a vent support that extends away from the third side of the mold cavity and aligns with the transverse vent.

* * * * *